US009337308B2

(12) United States Patent
Jang et al.

(10) Patent No.: US 9,337,308 B2
(45) Date of Patent: May 10, 2016

(54) SEMICONDUCTOR DEVICE AND METHOD FOR FORMING THE SAME

(71) Applicant: SK HYNIX INC., Icheon (KR)

(72) Inventors: Tae Su Jang, Gwacheon (KR); Min Soo Yoo, Icheon (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/288,167

(22) Filed: May 27, 2014

(65) Prior Publication Data

US 2014/0264570 A1    Sep. 18, 2014

Related U.S. Application Data

(62) Division of application No. 13/211,249, filed on Aug. 16, 2011, now Pat. No. 8,772,105.

(30) Foreign Application Priority Data

Jan. 3, 2011  (KR) ......................... 10-2011-0000219

(51) Int. Cl.
*H01L 21/8242* (2006.01)
*H01L 29/66* (2006.01)
(Continued)

(52) U.S. Cl.
CPC .... *H01L 29/66666* (2013.01); *H01L 27/10876* (2013.01); *H01L 29/7827* (2013.01)

(58) Field of Classification Search
CPC ................... H01L 29/66666; H01L 29/7827; H01L 27/0207; H01L 27/10823; H01L 27/10885; H01L 27/11582; H01L 2924/00; H01L 29/7926; H01L 29/66833; H01L 45/06; H01L 45/1233; H01L 45/144; H01L 27/2409; H01L 27/1157; H01L 27/2463; H01L 2224/32225; H01L 2224/73204; H01L 27/10876; H01L 27/10888; H01L 27/10814; H01L 21/76262; G11C 11/4085
USPC ...................... 257/68, 71, 300, 329, E27.087, 257/E27.088, E21.657, E21.658, 296, 314, 257/390, E21.132, E21.171; 438/262, 256, 438/399, 641, 674, 738
See application file for complete search history.

(56) References Cited

U.S. PATENT DOCUMENTS

| 5,534,453 | A | 7/1996 | Asaba |
| 6,208,555 | B1 | 3/2001 | Noble |
| 2002/0158280 | A1 * | 10/2002 | Shinkawata ................. 257/296 |

(Continued)

OTHER PUBLICATIONS

Taiwanese Office Action for Taiwanese Patent Application No. 100129147 dated Jun. 23, 2015.

*Primary Examiner* — Yosef Gebreyesus

(57) ABSTRACT

A semiconductor device and a method for forming the same are disclosed. The semiconductor device includes a first junction region formed at the bottom of a vertical pillar, a bit line formed below the first junction region, and an insulation film formed below the bit line. As a result, the 4F2-sized semiconductor device is provided and the bit line is configured in the form of a laminated structure of a conductive layer and a polysilicon layer, so that bit line resistance is reduced. In addition, the semiconductor device reduces ohmic contact resistance by forming silicide between the conductive layer and the polysilicon layer, and includes an insulation film at a position between the semiconductor substrate and the bit line, resulting in reduction of bit line capacitance. Therefore, the sensing margin of the semiconductor device is increased and the data retention time is also increased.

13 Claims, 12 Drawing Sheets

(51) Int. Cl.
*H01L 27/108* (2006.01)
*H01L 29/78* (2006.01)

(56) References Cited

U.S. PATENT DOCUMENTS

| | | |
|---|---|---|
| 2004/0058519 A1 | 3/2004 | Wu et al. |
| 2005/0112870 A1* | 5/2005 | Park .................. H01L 21/28525 438/647 |
| 2006/0006410 A1* | 1/2006 | Lee .................. H01L 27/10814 257/145 |
| 2006/0258084 A1 | 11/2006 | Tang et al. |
| 2007/0023805 A1* | 2/2007 | Wells ................ H01L 21/76254 257/295 |
| 2007/0173015 A1* | 7/2007 | Im ..................... H01L 27/10876 438/245 |
| 2008/0182367 A1* | 7/2008 | Petti ...................... H01L 27/105 438/142 |
| 2009/0242966 A1* | 10/2009 | Son .................... H01L 27/11578 257/324 |
| 2009/0242979 A1* | 10/2009 | Hong ............... H01L 21/823418 257/334 |
| 2010/0090348 A1 | 4/2010 | Park et al. |
| 2010/0155799 A1 | 6/2010 | Yokoyama |
| 2010/0230776 A1 | 9/2010 | Gogoi |
| 2010/0232200 A1* | 9/2010 | Shepard ............. G11C 13/0004 365/51 |
| 2010/0237405 A1* | 9/2010 | Shin .................. H01L 27/10876 257/329 |
| 2011/0143508 A1* | 6/2011 | Kim .................. H01L 27/10823 438/270 |
| 2011/0233723 A1* | 9/2011 | Tanioku ........................ 257/532 |
| 2012/0021575 A1* | 1/2012 | Jang .................. H01L 27/10876 438/269 |
| 2012/0074367 A1* | 3/2012 | Costa .................. H01L 27/1021 257/2 |

\* cited by examiner

SEMICONDUCTOR DEVICE AND METHOD FOR FORMING THE SAME

CROSS-REFERENCE TO RELATED APPLICATION

The present application is a divisional of U.S. patent application Ser. No. 13/211,249, filed on Aug. 16, 2011, which claims priority of Korean Patent Application No. 10-2011-0000219 filed on Jan. 3, 2011, which are incorporated by reference in their entirety.

BACKGROUND OF THE INVENTION

Embodiments of the present invention relate to a semiconductor device, and more particularly to a semiconductor device and a method for forming the same.

With the increasing degree of integration of semiconductor devices, the design rule is being gradually reduced. As the design rule is reduced, the development of highly-integrated semiconductor memory devices (for example, a Dynamic Random Access Memory (DRAM)) is reaching its physical limits. Therefore, research for reducing a unit area of a cell storing one bit (1 bit) of data is being conducted. Recently, the unit cell design implementation has transitioned from a 8F2-sized unit cell for storing one bit to a 6F2-sized or 4F2-sized unit cell, so that a high-density cell structure can be configured.

In order to construct a transistor having the 4F2-sized unit cell, it is necessary for a junction part corresponding to the source and drain part to be in the 1F2-sized format. To accomplish this, many developers and companies are conducting intensive research into a cell transistor including a vertical channel in which the source and the drain can be formed within the 1F2-sized format. For a cell transistor including a vertical channel, the source region and the drain region of the transistor capable of operating the cell are formed at lower and upper parts, respectively, and the transistor is operated through a vertical-shaped channel. In a device with these features, the source and drain regions that run horizontally within the 8F2-sized unit cell are located at upper and lower parts in such a manner that the source and drain regions are configured in the form of a vertical structure, so that the cell transistor can be operated within the 4F2-sized unit cell. However, a cell transistor structure having such a vertical channel is difficult to fabricate, and it is very difficult to form the cell transistor structure due to structural complexity.

BRIEF SUMMARY OF THE INVENTION

Various embodiments of the present invention are directed to providing a semiconductor device and a method for forming the same that substantially obviate one or more problems due to limitations and disadvantages of the related art.

An embodiment of the present invention relates to a semiconductor device and a method for forming the same, which solves some of the problems associated with highly integrated vertical cell transistors.

In accordance with an aspect of the present invention, a semiconductor device includes a first junction region formed at the bottom of a vertical pillar; a bit line formed below the first junction region; and an insulation film formed below the bit line.

The semiconductor device may further include a polysilicon layer formed between the pillar and the bit line.

The semiconductor device may further include a barrier conductive layer formed between the polysilicon layer and the bit line.

The barrier conductive layer may include either a laminated structure of titanium (Ti) and titanium nitride (TiN) films or cobalt (Co).

The semiconductor device may further include an amorphous silicon layer formed between the pillar and the bit line.

The bit line may include a metal-based material.

The semiconductor device may further include a gate oxide film formed at a lateral surface of the pillar; and a gate formed over the gate oxide film.

The semiconductor device may further include a second junction region formed over the pillar.

The semiconductor device may further include a barrier conductive layer and a conductive layer that are formed over the second junction region; and a storage node formed over the conductive layer.

In accordance with another aspect of the present invention, a method for forming a semiconductor device includes forming a recess by etching a semiconductor substrate; forming an insulation film at the bottom and sidewall of the recess; forming a bit line over the insulation film; forming a silicon layer over the semiconductor substrate in such a manner that the recess is buried; forming a first junction region at the bottom of the silicon layer by implanting ions in the silicon layer; and forming a pillar by etching the silicon layer, the first junction region and the semiconductor substrate.

The forming of the recess may include forming an oxide film and a hard mask pattern over the semiconductor substrate; and etching the oxide film and the semiconductor substrate using the hard mask pattern as an etch mask.

The recess may have a depth of 50 nm to 300 nm.

The method may further include, after forming the recess, performing an annealing process including $H_2$.

The forming of the insulation film at the bottom and sidewall of the recess may include forming an insulation material over the semiconductor substrate in such a manner that the recess is buried; and performing an etchback process on the insulation material.

The method may further include, after forming the bit line, forming a polysilicon layer over the bit line.

The method may further include forming a barrier conductive layer between the bit line and the polysilicon layer.

The method may further include, after forming the bit line, forming an amorphous silicon layer over the bit line.

The method may further include, after forming the bit line, exposing a surface of the semiconductor substrate and an upper part of the recess sidewall.

The exposing of the semiconductor substrate surface and the upper part of the recess sidewall may include performing ion implantation on an oxide film and the insulation film; and removing the ion-implanted oxide film and the ion-implanted insulation film by performing a cleaning process.

The method may further include, after exposing the surface of the semiconductor substrate and the upper part of the recess sidewall, forming an undoped amorphous silicon layer over the polysilicon layer, the recess sidewall, and the semiconductor substrate; forming a crystalline silicon layer by performing solid phase epitaxy on the undoped amorphous silicon layer; and forming the silicon layer by performing a selective epitaxial growth method using the crystalline silicon layer as a seed.

The method may further include, after exposing the surface of the semiconductor substrate and the upper part of the recess sidewall, performing heat treatment at a temperature of 200° C. to 1000° C. and $H_2$ atmosphere for 10 to 120 minutes.

The method may further include, after forming the silicon layer, performing a heat treatment process at a position between the bit line and the polysilicon layer, thereby forming silicide.

The heat treatment process may be performed at a temperature of 300° C. to 800° C. and $N_2$ atmosphere for 1 to 60 minutes.

The method may further include, after forming the silicon layer, performing a planarization etching process on the silicon layer.

The forming of the first junction region may include implanting N-type ion or P-type ion, wherein the N-type ion includes phosphorus (Ph) or arsenic (As) and the P-type ion includes boron (B).

The forming of the first junction region is performed under a process condition of a dose of $1E10/cm^2$ to $1E18/cm^2$ and energy of 1 KeV to 200 KeV.

The forming of the pillar by etching the silicon layer, the first junction region and the semiconductor substrate may include performing the etching to a predetermined depth corresponding to a height of an upper end of the bit line in a direction perpendicular to the bit line.

The method may further include, after forming the pillar, forming a gate oxide film at a sidewall of the pillar; forming a gate over the gate oxide film; and forming a second junction region over the pillar.

The method may further include, after forming the second junction region, forming a barrier conductive layer and a conductive layer over the second junction region; and forming a storage node over the conductive layer.

In accordance with still another aspect of the present invention, a method for forming a semiconductor device includes forming an insulation film pattern and a bit line over a semiconductor substrate; forming a silicon layer over the semiconductor substrate using the semiconductor substrate exposed by the bit line and the insulation film pattern as a seed; forming a first junction region at the bottom of the silicon layer by implanting ions into the silicon layer; and forming a pillar by etching the silicon layer and the first junction region.

The method may further include, after forming the bit line, forming a polysilicon pattern over the bit line.

The method may further include, after forming the insulation film pattern and the bit line over the semiconductor substrate, performing a heat treatment process on the semiconductor substrate.

The heat treatment process may be performed at a temperature of 400° C. to 1000° C. and atmosphere of $H_2$, Ar or $N_2$ for 10 to 3600 seconds.

The method may further include, after forming the insulation film pattern and the bit line, forming a spacer at sidewalls of the insulation film pattern, the bit line, and the polysilicon pattern.

The method may further include, after forming the spacer, forming an undoped amorphous silicon layer over the semiconductor substrate and the polysilicon pattern; forming a crystalline silicon layer by performing solid phase epitaxy on the undoped amorphous silicon layer; and forming the silicon layer by performing a selective epitaxial growth method using the crystalline silicon layer as a seed.

The forming of the silicon layer may include performing heat treatment at a temperature of 200° C. to 1000° C. and $H_2$ atmosphere for 10 to 120 minutes.

The method may further include, after forming the silicon layer, performing a heat treatment process at a position between the bit line and the polysilicon layer, thereby forming silicide.

The forming of the pillar by etching the silicon layer and the first junction region may include performing the etching to a predetermined depth corresponding to a height of an upper end of the bit line in a direction perpendicular to the bit line.

The method may further include, after forming the pillar, forming a gate oxide film at a sidewall of the pillar; forming a gate over the gate oxide film; and forming a second junction region over the pillar.

The method may further include, after forming the second junction region, forming a barrier conductive layer and a conductive layer over the second junction region; and forming a storage node over the conductive layer.

DESCRIPTION OF EMBODIMENTS

Reference will now be made in detail to embodiments of the present invention, examples of which are illustrated in the accompanying figures. Wherever possible, the same reference numbers will be used throughout the figures to refer to the same or similar elements.

Figure 1:
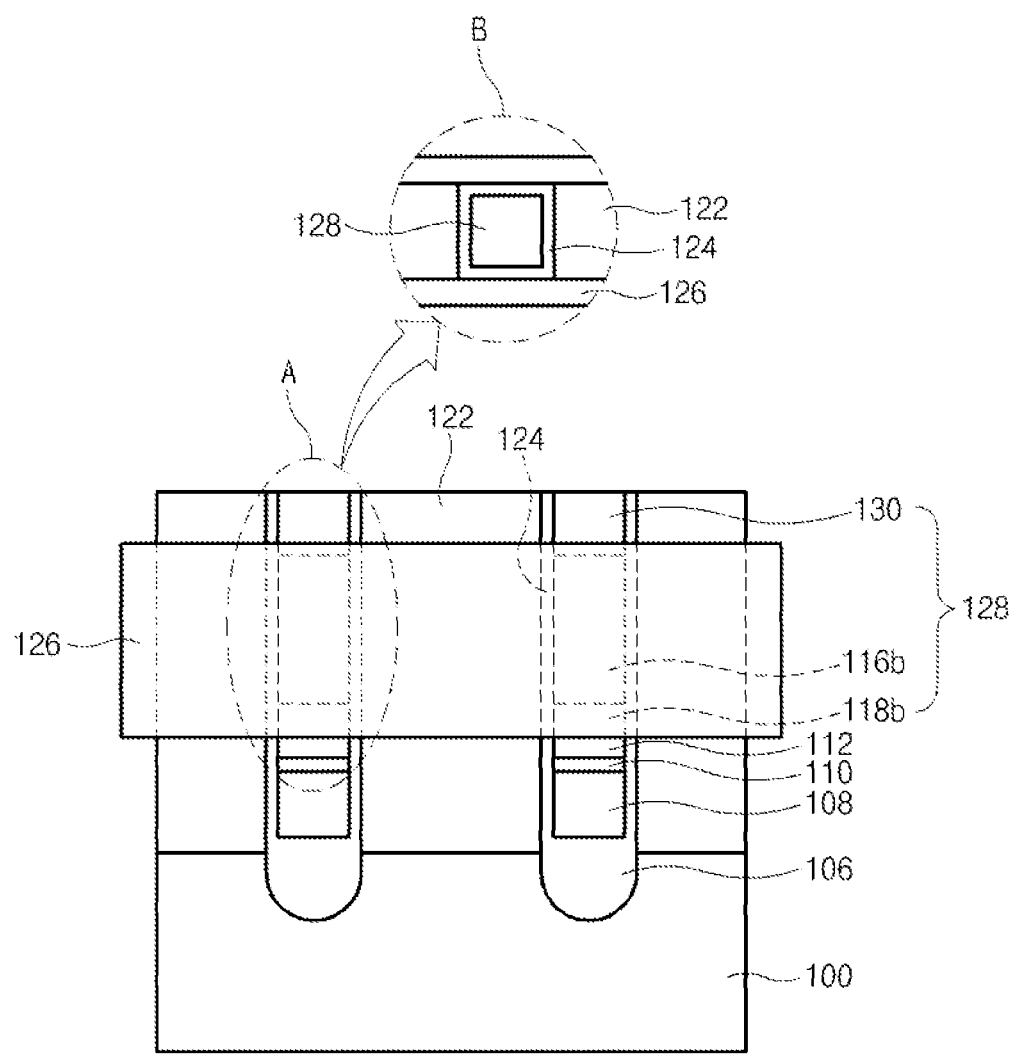
FIG. 1 is a cross-sectional view illustrating a semiconductor device according to one embodiment of the present invention.

FIG. 1 is a cross-sectional view illustrating a semiconductor device according to one embodiment of the present invention. Referring to FIG. 1, the semiconductor device according to this embodiment includes a first junction region 118b formed below a silicon layer 116b, a bit line 108 formed below the first junction region 118b, and an insulation film 106 formed below the bit line 108. Preferably, the bottom of the insulation film 106 is disposed below the upper surface of semiconductor substrate 100.

In addition, an embodiment may further include a barrier conductive layer 110 formed between a polysilicon layer 112 and a bit line 108; a gate oxide film 124 formed around a pillar 128; an interlayer insulation film 122 interposed between neighboring pillars; a gate 126 formed over lateral surfaces of the interlayer insulation film 122 and the pillar 128; and a second junction region 130 formed in the upper part of the pillar 128.

Preferably, the bit line 108 may include tungsten (W), and the barrier conductive layer 110 may include either a laminated structure of titanium (Ti) and titanium nitride (TiN) films or cobalt (Co). In addition, the polysilicon layer 112 may be replaced with an amorphous silicon layer.

In accordance with the present invention, the bit line is located at a lower extended line of the pillar, so that it can more easily provide the 4F2-sized structure. In an embodiment, the bit line includes a metal material to reduce resistance of the bit line and the bit line capacitance in order to improve the sensing margin and data retention characteristics.

A method for forming the above-mentioned semiconductor device according to one embodiment of the present invention will hereinafter be described with reference to the figures. FIGS. 2A to 2I are cross-sectional views illustrating a method for forming a semiconductor device according to one embodiment of the present invention.

Figure 2A:
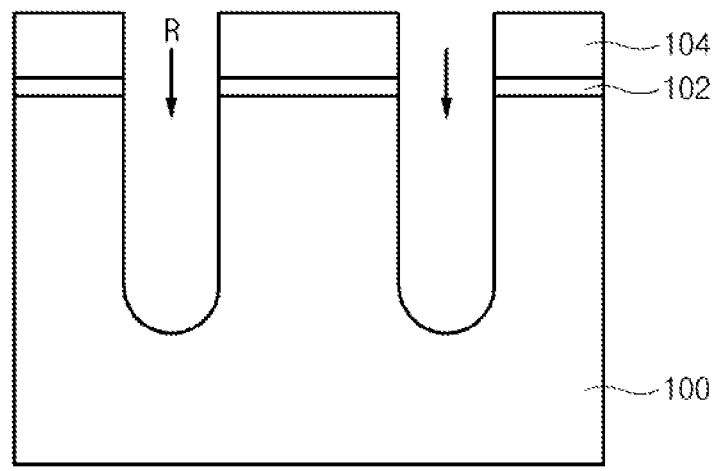
FIGS. 2A to 2I are cross-sectional views illustrating a method for forming a semiconductor device according to one embodiment of the present invention.

Referring to FIG. 2A, an oxide film 102 is formed over the semiconductor substrate 100, and a hard mask pattern 104 is formed over the oxide film 102. Subsequently, the oxide film 102 and the semiconductor substrate 100 are etched using the hard mask pattern 104 as an etch mask, so that the recess R is formed. Preferably, the recess R has a depth of 50 nm to 300 nm. After forming the recess R, a treatment may be performed to treat the surface damage of the recess (R). Preferably, the treatment process is an annealing process including $H_2$.

Figure 2B:
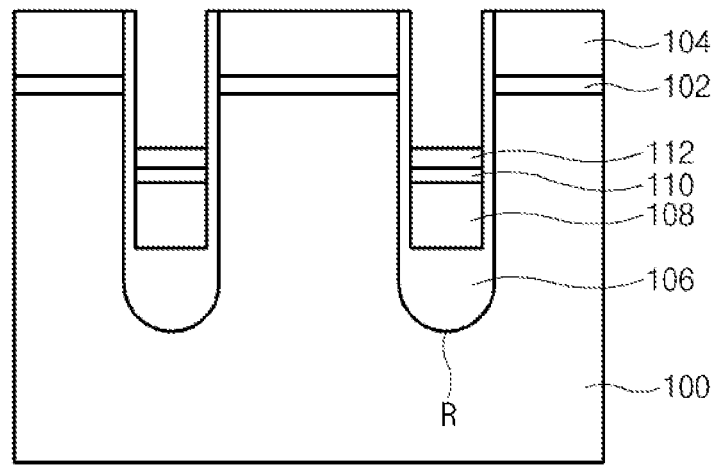

Referring to FIG. 2B, an insulation material is formed over the semiconductor substrate 100 including the recess (R), and is then etched back, leaving portions over surfaces of the recess (R). The remaining portions of the insulation film are insulation film 106. Preferably, the insulation film 106 may include a Spin On Dielectric (SOD), a High Density Plasma (HDP), a Tetra Ethyl Oxide Silicate (TEOS) or a boro phosousphorous glass (BPSG). It is preferable that the height of the insulation film 106 at the bottom of the recess R is from 10 nm to 100 nm.

Subsequently, a bit line metal material is formed over the insulation film 106, and is then etched back to form the bit line 108. The barrier metal material is formed over the bit line 108, and is then etched back to form the barrier conductive layer 110. Polysilicon is formed over the barrier conductive layer 110 and is then etched back, so that the polysilicon layer 112 is formed. The bit line 108 may include a metal-based material, and the barrier conductive layer 110 may include either a laminated structure of titanium (Ti) and titanium nitride (TiN) films or cobalt (Co). Preferably, the metal-based material includes tungsten (W), copper (Cu) or aluminum (Al). In this case, the polysilicon layer 112 may be changed to the amorphous silicon layer as necessary. In some embodiments, it is preferable that a laminated structure of the bit line 108, the barrier conductive layer 110, and the polysilicon layer 112 have a thickness of 10 nm to 100 nm.

Formation of the barrier conductive layer 110 may be used to increase adhesion between bit line 108 and polysilicon layer 112. Formation of the polysilicon layer 112 enables the junction region 118 (See '118' of FIG. 2G) formed in a subsequent process to ohmically contact the bit line 108 in order to prevent the occurrence of a junction leakage current.

Figure 2C:
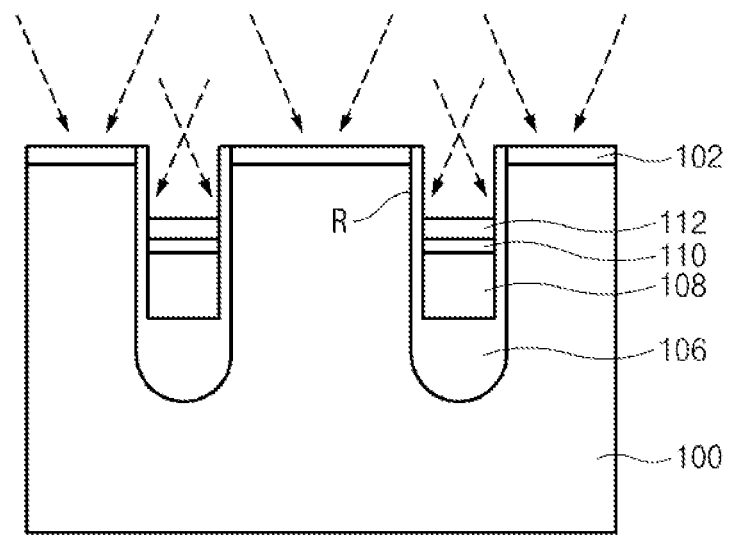

Referring to FIG. 2C, after removing the hard mask pattern 104, tilt ion implantation is performed not only on the oxide film 102 formed over the semiconductor substrate 100, but also on portions of the insulation film 106 formed over an upper sidewall of the recess (R). The resultant oxide film 102 and portions of insulation film 106 that were affected by the tilt ion implantation are easily removed by a cleaning process because the etch selection ratio of the implanted portions of the films is higher than that of the substrate 100, non-ionized portions of insulation film 106, and polysilicon layer 112.

Figure 2D:
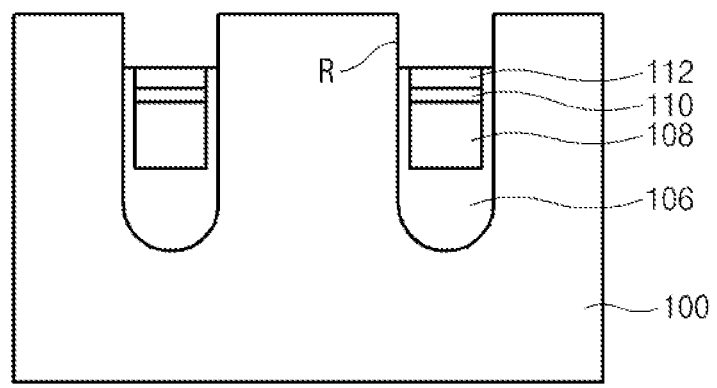

Referring to FIG. 2D, the oxide film 102 formed over the ion-implanted semiconductor substrate 100 and the insulation film 106 formed over the upper sidewall of the recess R are removed by a cleaning process. As a result, the upper surface of the semiconductor substrate 100 and portions of substrate 102 forming an upper sidewall of the recess R are exposed.

Figure 2E:
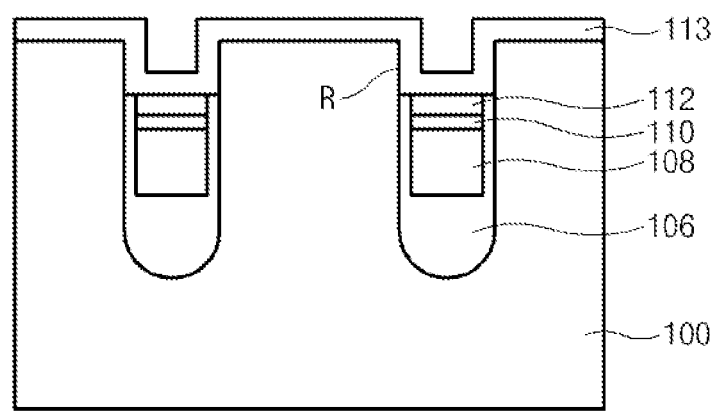

Referring to FIG. 2E, undoped amorphous silicon 113 is formed not only over the exposed semiconductor substrate 100, but also over the upper sidewall of the recess R.

Figure 2F:
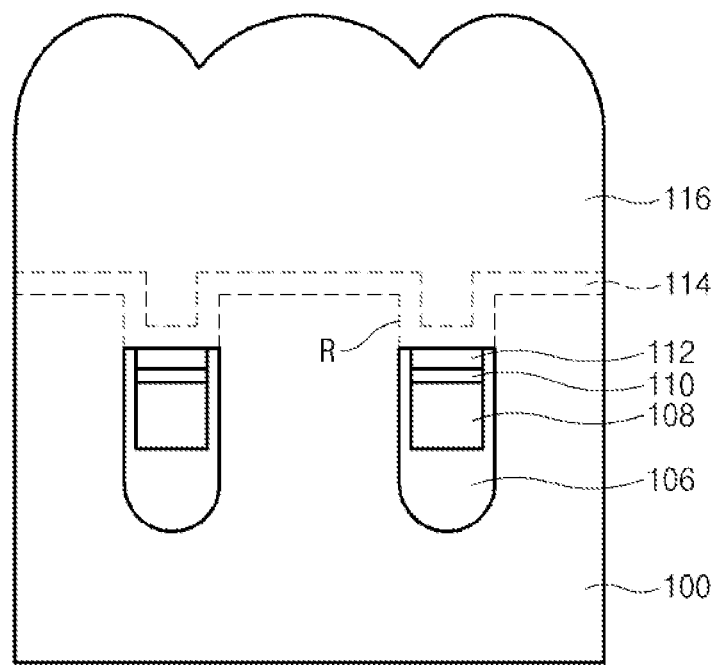

Referring to FIG. 2F, the undoped amorphous silicon 113 is heat-treated using solid phase epitaxy so that crystalline silicon 114 is formed. Thereafter, silicon layer 116 is formed using a selective epitaxial growth method in which the crystalline silicon 114 is used as a seed. In this embodiment, silicon layer 116 is used to bury the upper part of recess R, and is grown from the surface of the underlying structure so that the resultant silicon layer 116 has a specific height.

The silicon layer 116 may be formed to have the height of 10 nm to 1000 nm from the surface of the semiconductor substrate 100. In this case, the silicon layer 116 may be grown not only through the selective epitaxial growth method, but also through a heat treatment that is conducted for 10 to 120 minutes at a temperature of 200° C. to 1000° C. in an $H_2$ environment.

After the silicon layer 116 is formed, heat treatment may be performed on the silicon layer 116, so that a silicide material (not shown) is formed between the barrier conductive layer 110 and the polysilicon layer 112. Preferably, the heat treatment is performed at a temperature of 300° C. to 800° C. and an $N_2$ environment for 1 to 60 minutes.

Figure 2G:
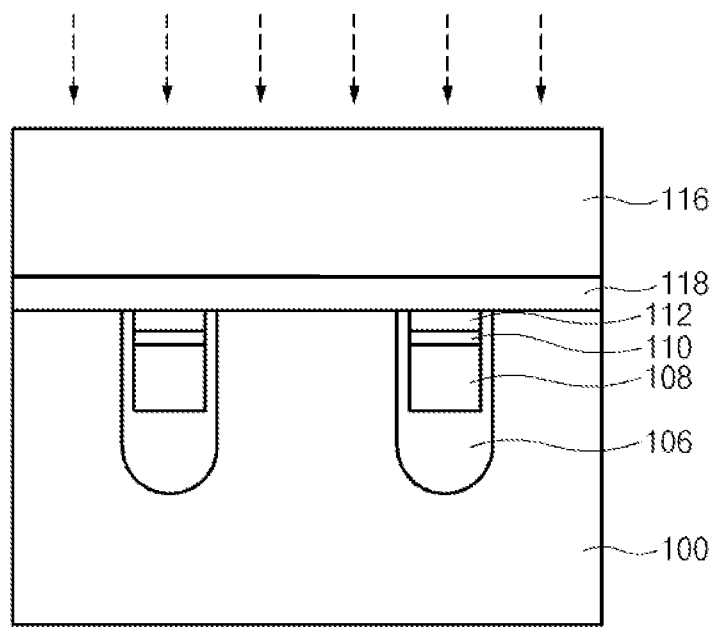

Referring to FIG. 2G, a planarization etching process is performed on the silicon layer 116, and N-type ions or P-type ions are implanted so that the first junction region 118 is formed. In this case, the planarization etching process may be conducted in such a manner that the laminated structure of portions of the first junction region 118 and silicon layer 116 formed over the polysilicon layer 112 have a thickness of 10 nm to 200 nm. If the above-mentioned laminated structure has a thickness of 10 nm or less, it is impossible for the laminated structure to be used as a transistor. If the above-mentioned laminated structure has a thickness of 200 nm or higher, resistance is increased so that it is also impossible for the laminated structure to be used as a transistor. Preferably, N-type ions include phosphorus (Ph) or arsenic (As), and P-type ions include boron (B) or $BF_2$. In addition, the ion implantation process may be performed under the process condition of a dose of $1E10/cm^2$ to $1E18/cm^2$ and energy of 1 KeV to 200 KeV.

Figure 2H:
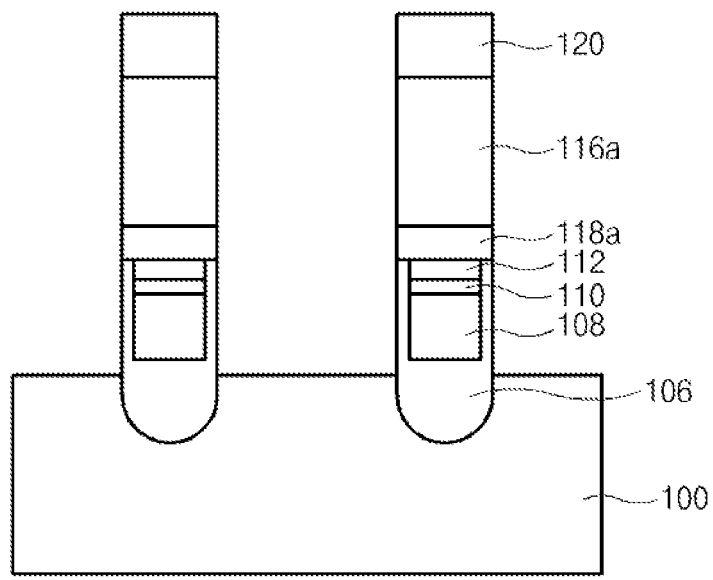

Referring to FIG. 2H, after a mask pattern 120 is formed over the silicon layer 116, the silicon layer 116, the first junction region 118, and the semiconductor substrate 100 are etched using mask pattern 120 as an etch mask so that an upper sidewall of the insulation film 106 is exposed, and a line-type laminated structure, including the line-type silicon layer 116a and the first line-type junction region 118a, extended in a first direction, is formed. In an embodiment, the mask pattern 120 may be a line-and-space type having a long axis in the first direction.

Figure 2I:
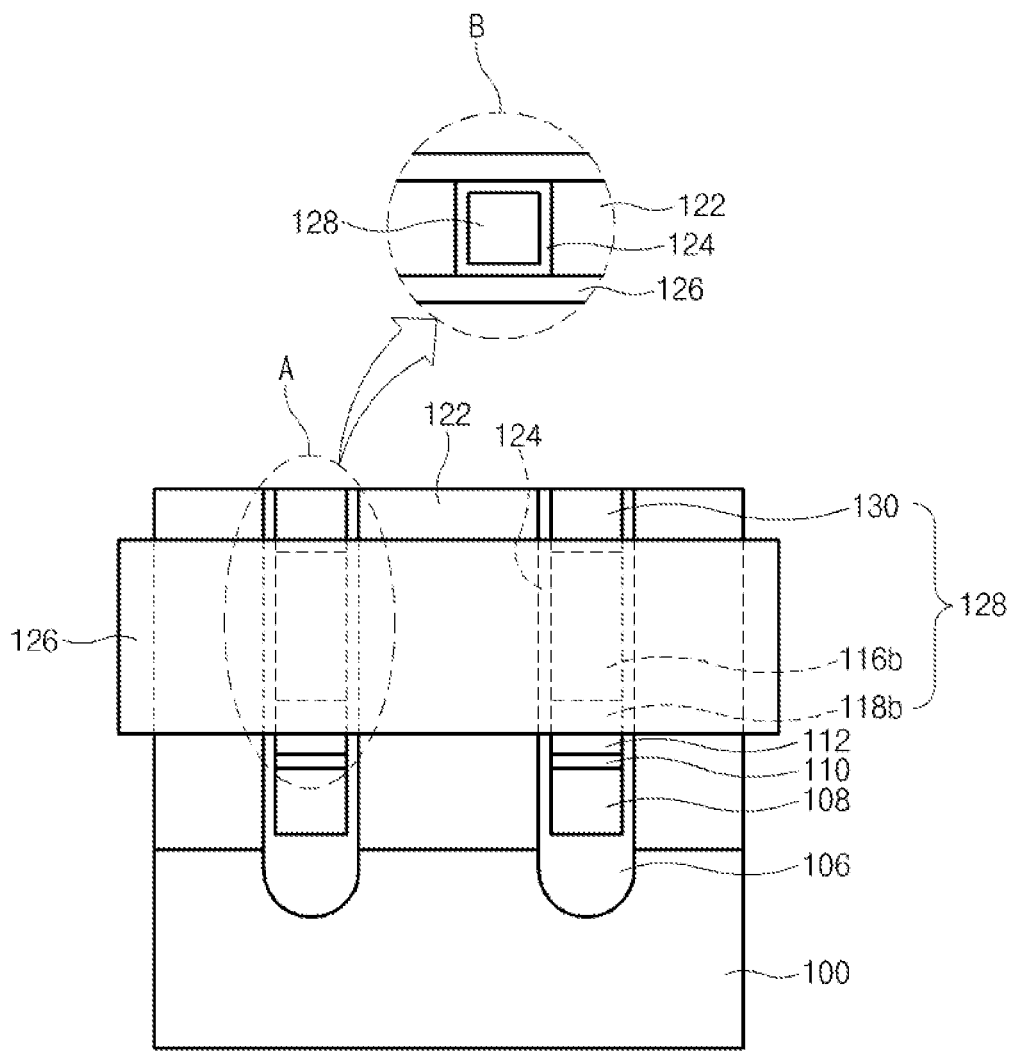

Referring to FIG. 2I, an interlayer insulation film 122 is formed between line-type laminated structures. Preferably, the interlayer insulation film 122 may include high density plasma (HDP) or spin on dielectric (SOD). Thereafter, the line-type laminated structure and the interlayer insulation film 122 are etched in a second direction (the left-to-right horizontal direction of FIG. 2H) perpendicular to the first direction, so that the pillar 128 is formed. In this embodiment, the first direction is parallel to the long-axis direction of the bit line 108. Therefore, in the case of the pillar 128, when the line-type laminated structure is etched in the second direction, the line-type silicon layer 116a extended in the first direction and the line-type first junction region 118a extended in the first direction are etched to a depth equal to or above an upper surface of bit line 108, so that pillar 128 may be formed. The pillar 128 may have a square or tetragon type as shown in 'B,' which shows a plan view of portion 'A' of FIG. 2I.

Thereafter, the gate oxide film 124 is formed over a lateral surface of pillar 128, and the gate 126 is formed over the gate oxide film 124 with a long axis extending in a second direction. Preferably, the gate oxide film 124 is formed by oxidization of the surface of the pillar 128.

Thereafter, an insulation film 122 is formed between gates 126, and mask pattern 120 is removed. As a result, the pillar 128 is exposed, and ion implantation is performed on the exposed portion of silicon layer 116b, so that the second junction region 130 is formed. In this embodiment, the first junction region 118b and the second junction region 130 are used as a source or drain, so that a vertical channel is formed in the pillar 128. Although not shown in the drawings, it is preferable that a barrier conductive layer and a conductive layer are formed over the second junction region 130, and the storage electrode is then formed.

In accordance with a method for forming the semiconductor device according to one embodiment of the present invention, a recess is formed in the semiconductor substrate and a bit line is formed at a lower portion of the pillar, so that a 4F2-sized semiconductor device is formed. After an insulation film is formed, the bit line is formed over the insulation, so that parasitic capacitance of the bit line is reduced, and at the same time the data sensing margin and the data retention time can be increased. In addition, the bit line is formed of metal so that bit line resistance is reduced. Silicide is formed between the barrier conductive layer and the polysilicon layer to reduce contact resistance, so that the possibility of generating defects at an interface between bit lines may be reduced.

The scope of the present invention is not limited to the above-described method and structure. Another embodiment of the invention includes forming a pillar over a substrate without forming a recess in the substrate. A detailed description thereof will hereinafter be described with reference to FIGS. 3 and 4A to 4F.

Figure 3:
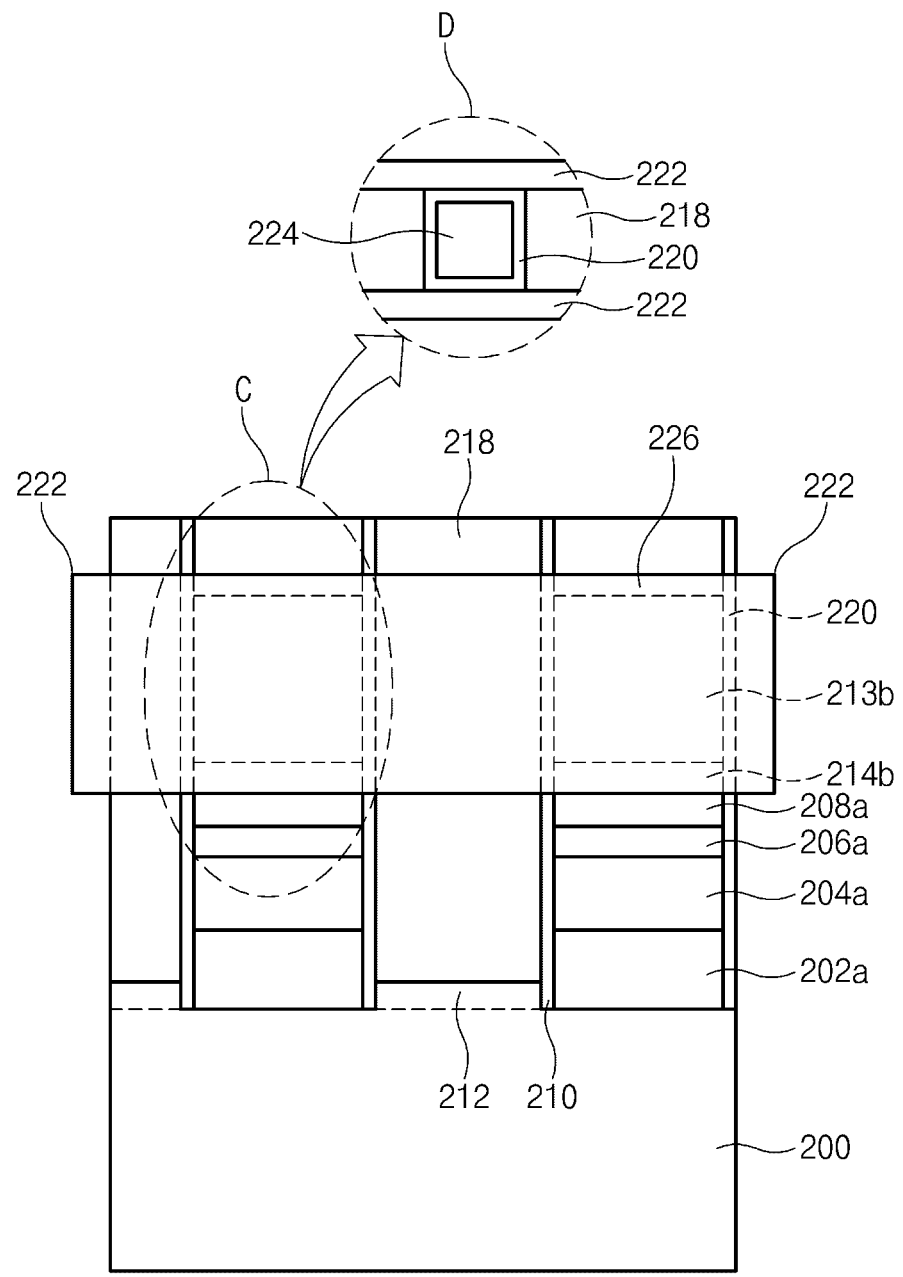
FIG. 3 is a cross-sectional view illustrating a semiconductor device according to a second embodiment of the present invention.

FIG. 3 is a cross-sectional view illustrating a semiconductor device according to a second embodiment of the present invention. FIGS. 4A to 4G are cross-sectional views illustrating a method for forming a semiconductor device according to a second embodiment of the present invention.

Referring to FIG. 3, a semiconductor device according to a second embodiment of the present invention includes a pillar 224, a first junction region 214b formed below the silicon layer 213b, a bit line 204a formed below the first junction region 214b, and an insulation film pattern 202a formed below the bit line 204a.

In addition, the semiconductor device according to a second embodiment of the present invention may further include a barrier metal pattern 206a formed between the bit line 204a and a polysilicon pattern 208a, a gate oxide film 220 formed around a pillar 224, an interlayer insulation film 218 formed between neighboring pillars 224, a gate 222 formed over the interlayer insulation film 218 and the pillar 224, and a second junction region 226 formed in the upper part of the pillar 224.

In this embodiment, the bit line 204a may include tungsten (W), and barrier metal pattern 206a may include either a laminated structure of Ti and TiN films or cobalt (Co). In some embodiments, polysilicon pattern 208a may be an amorphous silicon layer.

A method for forming a semiconductor device according to a second embodiment of the present invention will hereinafter be described with reference to FIGS. 4A to 4F.

Figure 4A:
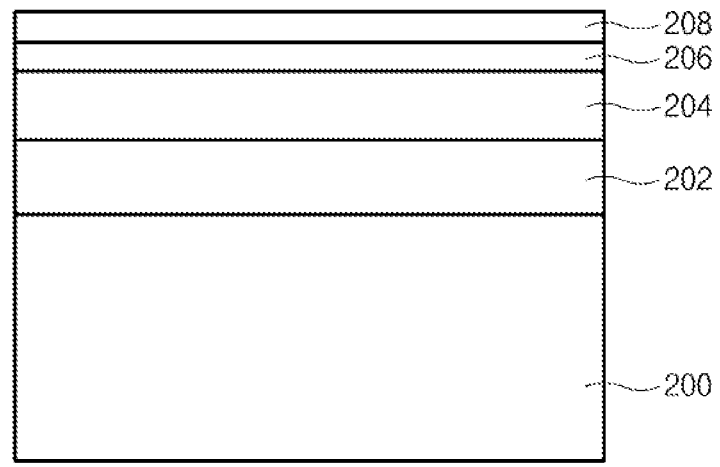
FIGS. 4A to 4G are cross-sectional views illustrating a method for forming a semiconductor device according to a second embodiment of the present invention.

Referring to FIG. 4A, an oxide film 202, a bit line conductive film 204, a barrier conductive film 206 and a polysilicon layer 208 are formed over the semiconductor substrate 200. The oxide film 202 may be formed or grown to have a thickness of 10 nm to 500 nm by a chemical vapor deposition (CVD) or heat oxidation process. The bit line conductive layer 204 may include tungsten (W), and the barrier conductive layer 206 may include either a laminated structure of Ti and TiN films or cobalt (Co). In addition, the polysilicon layer 208 may be replaced with an amorphous silicon layer as necessary.

Figure 4B:
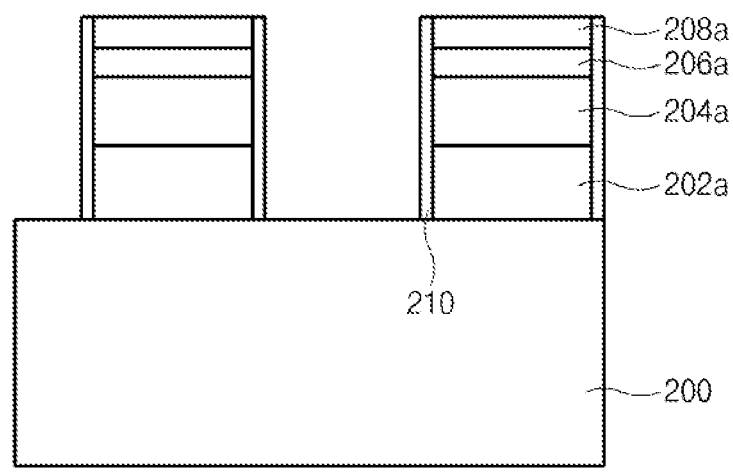

Referring to FIG. 4B, a mask pattern (not shown) is formed over the polysilicon layer 208, and polysilicon layer 208 is etched using the mask pattern (not shown) as an etch mask, so that the polysilicon pattern 208a, the barrier metal pattern 206a, the bit line 204a, and the oxide film pattern 202a are formed. In addition, the process exposes a surface of the semiconductor substrate 200. In order to prevent the surface of the exposed semiconductor substrate 200 from being damaged, it is preferable that a treatment process is performed. Specifically, heat treatment may be performed in an atmosphere of $H_2$, Ar or $N_2$. Preferably, the heat treatment is performed at a temperature of 400° C. to 1000° C. for 10 to 3600 seconds.

Subsequently, a spacer 210 is formed over sidewalls of the polysilicon pattern 208a, the barrier metal pattern 206a, the bit line 204a, and the oxide film pattern 202a. Preferably, after forming an insulation film, the spacer 210 may be formed by an etchback process.

Figure 4C:
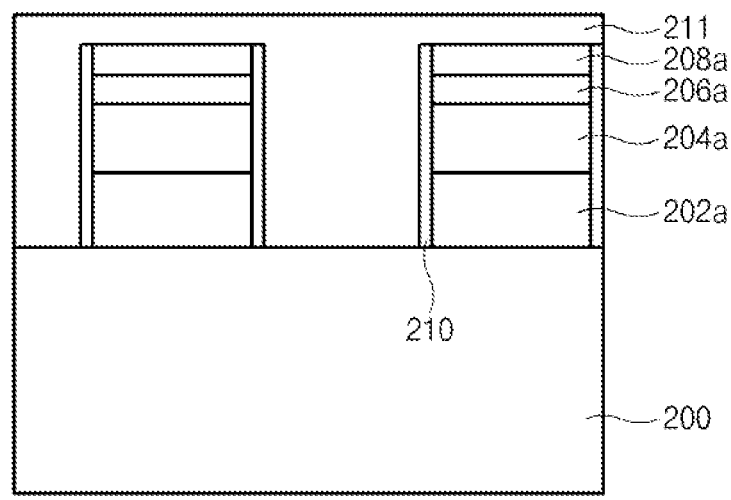

Referring to FIG. 4C, undoped amorphous silicon 211 is formed over the semiconductor substrate 200 and the polysilicon pattern 208a.

Figure 4D:
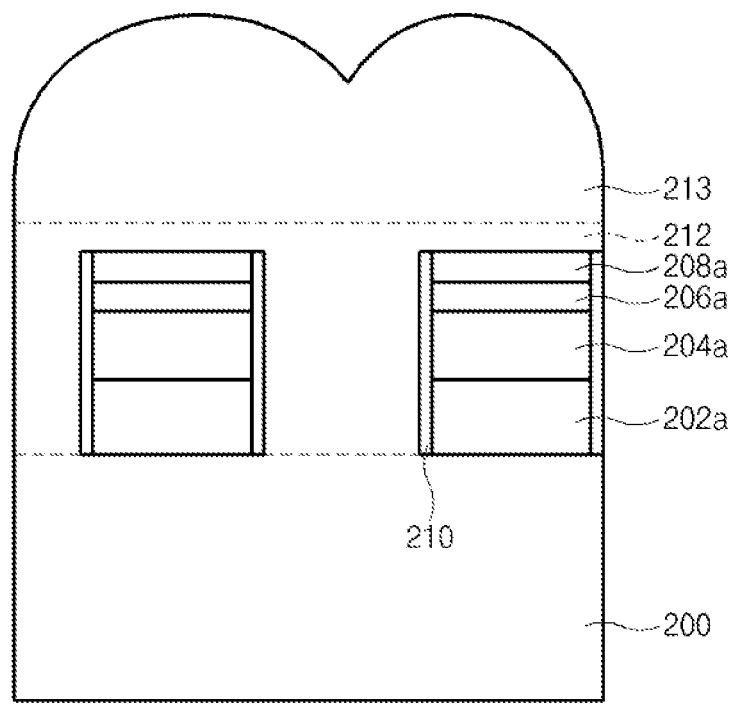

Referring to FIG. 4D, the undoped amorphous silicon layer 211 is heat-treated using solid phase epitaxy so that crystalline silicon 212 is formed. Thereafter, silicon layer 213 is formed using a selective epitaxial growth method in which the crystalline silicon 212 is used as a seed.

The silicon layer 213 may be formed to have a height of 10 nm to 1000 nm on the basis of the height of the barrier metal pattern 206a. The silicon layer 213 may be grown through a selective epitaxial growth method, and it may be heat treated in a process that is conducted at a temperature of 200° C. to 1000° C. and an $H_2$ atmosphere.

After the silicon layer 213 is formed, heat treatment is performed on the silicon layer 213, so that a silicide material (not shown) is formed between the barrier metal pattern 206a and the polysilicon pattern 208a. Preferably, heat treatment is performed at a temperature of 300° C. to 800° C. and an $N_2$ atmosphere for 1 to 60 minutes. If the polysilicon pattern 208a is formed of amorphous silicon, it is preferable that the amorphous silicon is changed to crystalline polysilicon while heat treatment is conducted by solid phase epitaxy.

Figure 4E:
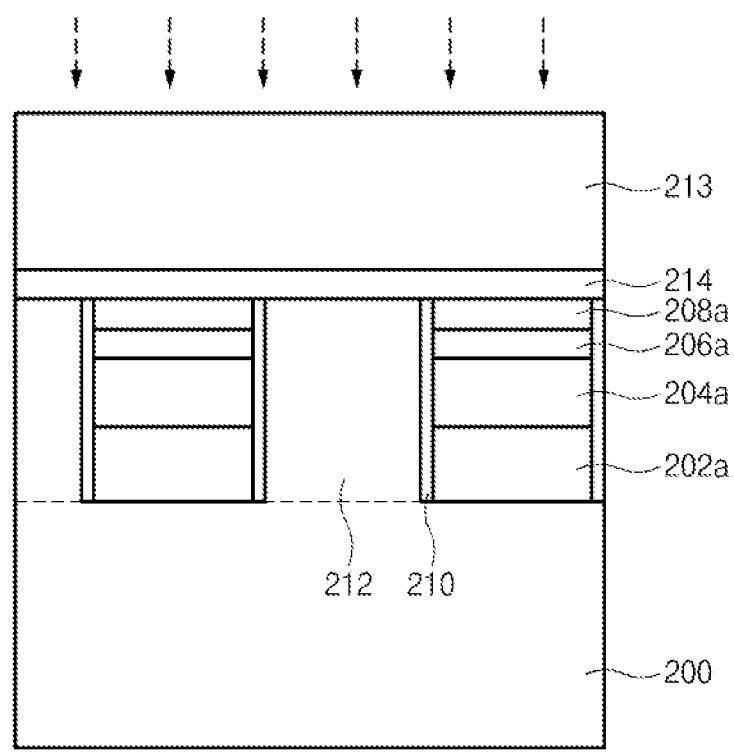

Referring to FIG. 4E, a planarization etching process is performed on silicon layer 213, and N-type ions or P-type ions are implanted so that the first junction region 214 is formed. Preferably, N-type ions include phosphorus (Ph) or arsenic (As), and P-type ions include boron (B) or $BF_2$. The ion implantation process may be performed with a dose of $1E10/cm^2$ to $1E18/cm^2$ and energy of 1 KeV to 200 KeV.

Figure 4F:
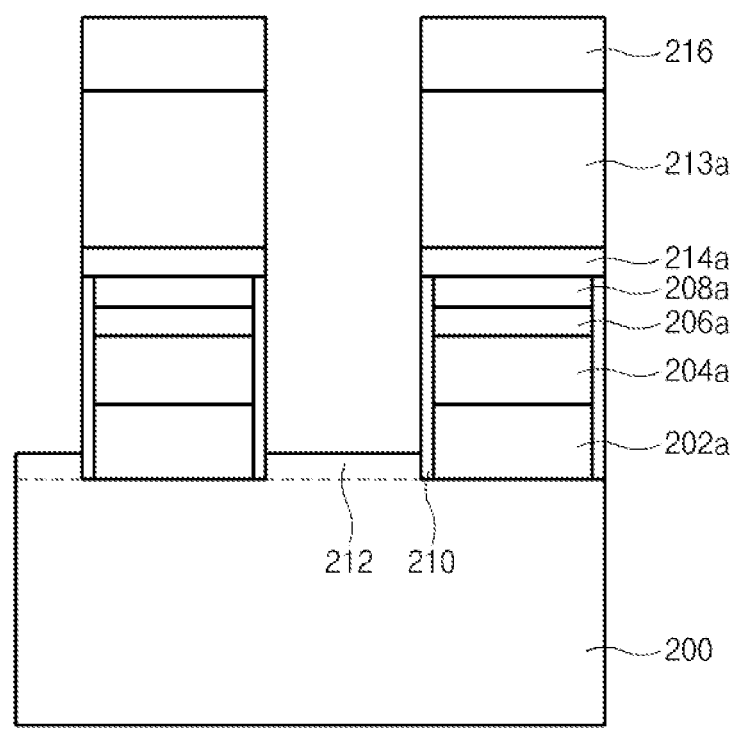

Referring to FIG. 4F, after a mask pattern 216 is formed over silicon layer 213, silicon layer 213 and the first junction region 214 are etched using the mask pattern 216 as an etch mask so that an upper sidewall of the oxide film pattern 202a is exposed, and the line-type laminated structure, including the first line-type silicon layer 213a and the first line-type junction region 214a, is formed extending in a first direction parallel to the long axis of bit line 204a. In this embodiment, silicon layer 213 is etched to a point below the upper surface of oxide film pattern 202a, so that the semiconductor substrate remains covered by portions of crystalline silicon 212. The mask pattern 216 may be a line-and-space type having a long axis in the first direction.

Figure 4G:
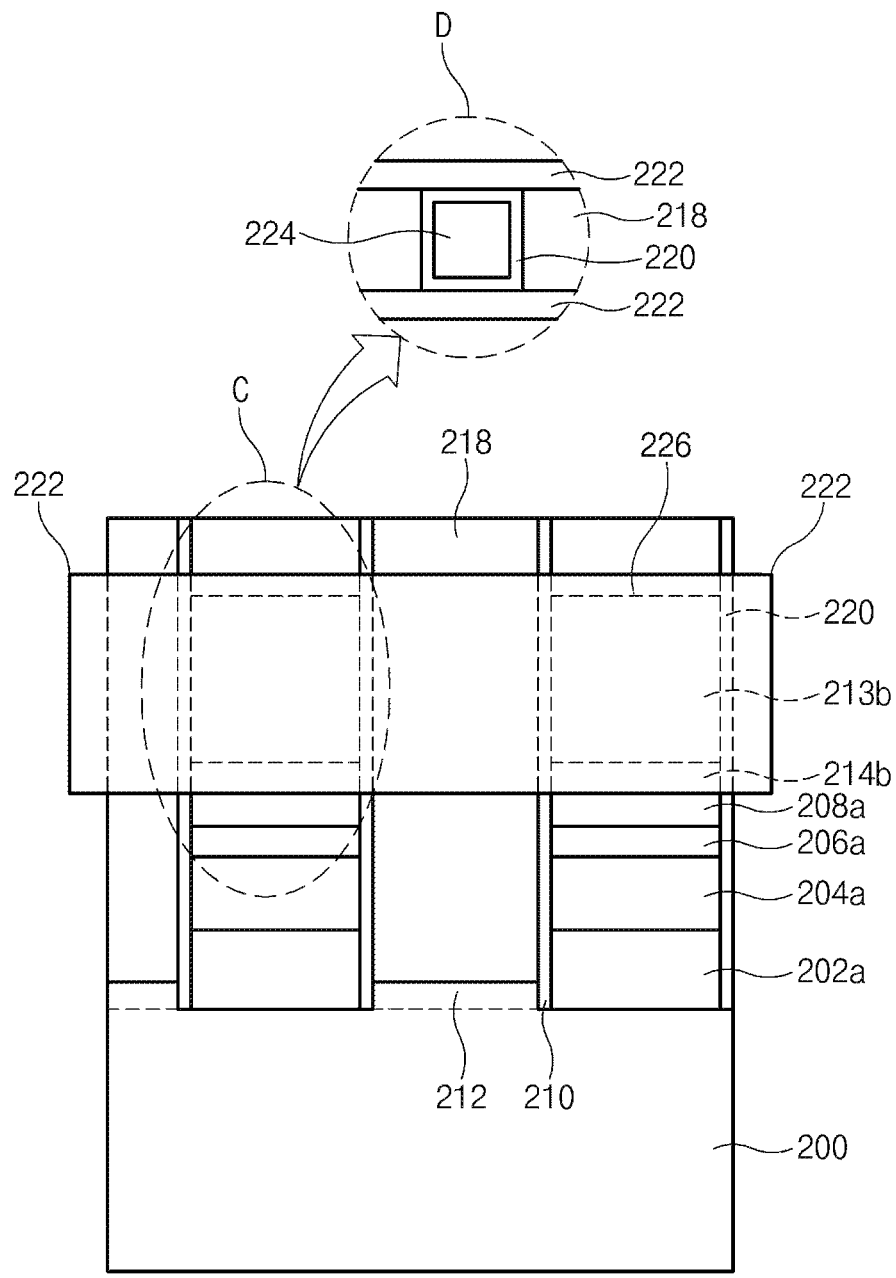

Referring to FIG. 4G, an interlayer insulation film 218 is formed between the line-type laminated structures. The interlayer insulation film 218 may be formed by a high density plasma (HDP) or Spin on dielectric (SOD) process. Thereafter, the line-type laminated structure is etched in a second direction perpendicular to the first direction, so that the pillar 224 is formed. In more detail, before etching, silicon layer 213a and first junction region 214a extend in a first direction. An etching process is performed in a second direction perpendicular to the first direction up to a depth of the upper edge of bit line 208, thereby forming pillar 224. In some embodiments, the depth can be above the upper edge of bit line 208. The pillar 224 may be a square or tetragon type as shown in 'D,' which shows a plan view of the 'C' part of FIG. 4G.

Thereafter, a gate oxide film 220 is formed around the pillar 224, and a gate 222 having a long axis extended in the second direction is formed over the gate oxide film 220. Preferably, the gate oxide film 220 is formed by oxidization of the surface of the pillar 224.

Thereafter, an insulation film (not shown) is buried between the gates 222, and mask pattern 216 is removed. Then, ion implantation is performed on the exposed silicon layer 213b, so that the second junction region 226 is formed. In this embodiment, the first junction region 214b and the second junction region 226 are used as a source or drain, so that a vertical channel is formed in the pillar 224.

Although not shown in the drawings, it is preferable that a barrier conductive layer and a conductive layer are formed over the second junction region 226, and a storage electrode is then formed over the conductive layer.

As is apparent from the above description, the above-described method for forming a semiconductor device according to a second embodiment of the present invention forms an insulation film over the semiconductor substrate, and forms a bit line over the insulation film to reduce capacitance of the bit line and at the same time increases the data sensing margin and the data retention time. In addition, the bit line is formed at a lower extended line of the pillar formed in a subsequent process so that the 4F2-sized structure can be completed. The bit line is formed of metal so that bit line resistance is reduced. Silicide is formed between the barrier conductive layer and the polysilicon layer so as to reduce contact resistance, so that the possibility of generating a defect at an interface between bit lines may be reduced.

The above embodiment of the present invention is illustrative and not limitative. Various alternatives and equivalents are possible. The invention is not limited by the embodiment described herein. Nor is the invention limited to any specific type of semiconductor device. Other additions, subtractions, or modifications are obvious in view of the present disclosure and are intended to fall within the scope of the appended claims.

What is claimed is:

1. A method for forming a semiconductor device comprising:
    forming an insulation film pattern and a bit line over a semiconductor substrate;
    after forming the bit line, forming a silicon layer over the bit line by performing a selective epitaxial growth method;
    forming a first junction region at a base of the silicon layer by implanting ions into the silicon layer; and
    forming a pillar by etching the silicon layer and the first junction region.

2. The method according to claim 1, further comprising:
    forming a polysilicon pattern over the bit line.

3. The method according to claim 2, wherein a lower surface of the first junction region is in direct contact with an upper surface of the polysilicon pattern.

4. The method according to claim 1, further comprising:
    performing a heat treatment process on the semiconductor substrate.

5. The method according to claim 4, wherein the heat treatment process is performed at a temperature of 400° C. to 1000° C. and an atmosphere of $H_2$, Ar or $N_2$ for 10 to 3600 seconds.

6. The method according to claim 4, further comprising:
    forming a spacer at sidewalls of the insulation film pattern, the bit line, and a polysilicon pattern.

7. The method according to claim 6, wherein the forming of the silicon layer includes:
    forming an undoped amorphous silicon layer over the semiconductor substrate and the polysilicon pattern;
    forming a crystalline silicon layer by performing solid phase epitaxy on the undoped amorphous silicon layer; and
    performing a selective epitaxial growth method using the crystalline silicon layer as a seed.

8. The method according to claim 1, wherein the forming of the silicon layer includes:
    performing heat treatment at a temperature of 200° C. to 1000° C. in an $H_2$ atmosphere for 10 to 120 minutes.

9. The method according to claim 1, wherein the forming of the pillar by etching the silicon layer and the first junction region includes:
    performing the etching to a predetermined depth corresponding to a height of an upper surface of the bit line in a direction perpendicular to the bit line.

10. The method according to claim 1, further comprising:
    forming a gate oxide film over a sidewall of the pillar;
    forming a gate over the gate oxide film; and
    forming a second junction region in an upper portion of the pillar.

11. The method according to claim 1, wherein a bottom surface of a barrier metal pattern directly contacts an upper surface of the bit line.

12. The method according to claim 1, further comprising forming a semiconductor substrate,
    wherein, after forming the semiconductor substrate, the insulation film pattern and the bit line are formed over the semiconductor substrate.

13. A method for forming a semiconductor device comprising:
    forming an insulation film pattern and a bit line over a semiconductor substrate;
    forming a polysilicon pattern over the bit line;
    performing a heat treatment process on the semiconductor substrate;
    forming a spacer at sidewalls of the insulation film pattern, the bit line, and the polysilicon pattern;
    forming an undoped amorphous silicon layer over the semiconductor substrate and the polysilicon pattern;
    forming a crystalline silicon layer by performing solid phase epitaxy on the undoped amorphous silicon layer;
    forming a silicon layer over the semiconductor substrate, wherein the silicon layer is formed by performing a selective epitaxial growth method using the crystalline silicon layer as a seed;
    forming a first junction region at a base of the silicon layer by implanting ions into the silicon layer; and
    forming a pillar by etching the silicon layer and the first junction region.

* * * * *